(12) United States Patent
Shinya et al.

(10) Patent No.: US 6,624,573 B2
(45) Date of Patent: Sep. 23, 2003

(54) FLUORESCENT DISPLAY DEVICE

(75) Inventors: Soichi Shinya, Mobara (JP); Toshio Suzuki, Mobara (JP); Kazuhiko Tojo, Mobara (JP); Klaus Heynen, Geldern (DE)

(73) Assignee: Futaba Corporation, Mobara (JP)

( * ) Notice: Subject to any disclaimer, the term of this patent is extended or adjusted under 35 U.S.C. 154(b) by 92 days.

(21) Appl. No.: 09/993,599

(22) Filed: Nov. 27, 2001

(65) Prior Publication Data

US 2002/0063512 A1 May 30, 2002

(30) Foreign Application Priority Data

Nov. 28, 2000 (JP) ......................................... 2000-361415

(51) Int. Cl.⁷ ................................................. H01J 1/62
(52) U.S. Cl. ........................................ 313/513; 313/495
(58) Field of Search .................... 174/50, 50.5, 50.52, 174/50.6, 50.64, 52.1, 17 R, 17.05, 17.08, 18, 260, 263, 138 G, 138 H; 313/491, 493, 495, 317, 324, 513, 514, 498, 510, 312; 362/221, 222; 739/80, 81, 733.1, 74, 66, 284

(56) References Cited

U.S. PATENT DOCUMENTS 6,093,053 A * 7/2000 Horioka et al. ............... 439/81
6,504,107 B1 * 1/2003 Kragl ......................... 174/260

* cited by examiner

*Primary Examiner*—Nimeshkumar D. Patel
*Assistant Examiner*—Sharlene Leurig
(74) *Attorney, Agent, or Firm*—Oblon, Spivak, McClelland, Maier & Neustadt, P.C.

(57) ABSTRACT

A fluorescent display device capable of minimizing a variation in pitches between lead terminals and deformation thereof and attaining mounting of the device on a circuit board without soldering. The lead terminals each are bent at a distal end thereof so that the distal end is held in each of terminal holding holes of a mounting holder to hold the mounting holder therein, so that the fluorescent display device is mounted on the circuit board while keeping the mounting holder and circuit board fixed to each other through a fixing structure and keeping the lead terminals pressedly contacted with connections on the circuit board.

3 Claims, 13 Drawing Sheets

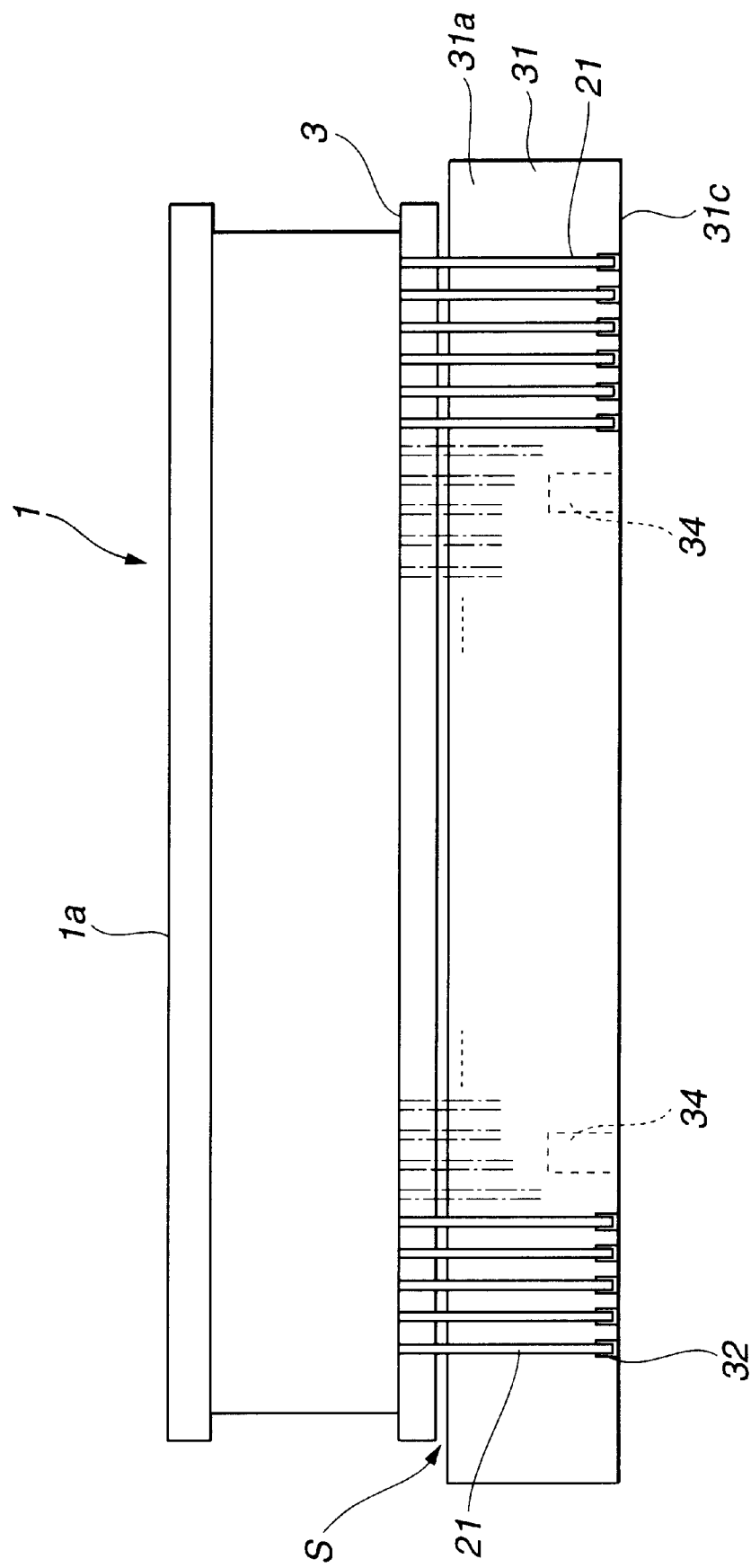

FLUORESCENT DISPLAY DEVICE

BACKGROUND OF THE INVENTION

This invention relates to a fluorescent display device adapted to impinge electrons emitted from an electron emission source such as a filamentary cathode, a field emission cathode (FEC) or the like on a phosphor to carry out desired display, and more particularly to a fluorescent display device in the form of a tube which facilitates mounting thereof on a circuit board (printed circuit board) on which various circuit parts are mounted and minimizes a variation in pitches of lead terminals and deformation thereof.

Now, a conventional fluorescent display device which has been widely known in the art will be described with reference to FIGS. 7 and 8.

The conventional fluorescent display device generally designated at reference numeral 1, as shown in FIG. 7, includes an envelope 2 which is formed into a box-like shape and has an interior hermetically kept at a high vacuum. The envelope 2 includes a lid-like casing 6 constituted by an insulating substrate 3, an insulating and light-permeable front cover 4, and an insulating frame-like side plate 5.

The substrate 3 of the envelope 2, as shown in FIG. 8, is formed on an inner surface thereof with a wiring layer 7 of a predetermined pattern corresponding to a display pattern 8 and wirings between segments or picture cells 10. The wiring layer 7 has an insulating layer 9 laminatedly formed thereon. The insulating layer 9 is formed by subjecting an insulating glass paste consisting of, for example, a lead borosilicate glass powder, a powder of an inorganic material such as a heat-resistant pigment or the like, and a vehicle to thick film printing. The insulating layer 9 is formed at a portion thereof corresponding to each of the segments or picture cells 10 of the display pattern 8 with a through-hole 11, through which the wiring layer 7 is exposed. The through-hole 11 through which the wiring layer 7 is exposed is closed with a conductor layer 12 by printing of a conductive paste.

The insulating layer 9, as shown in FIG. 8, is formed thereon with anode conductors 13, each of which is discretely allocated for every segment 10 of the display pattern 8 so as to be electrically connected through each of the conductor layers 12 to the wiring layer 7. The anode conductors 13 each are formed of, for example, a graphite paste consisting of a graphite powder and an inorganic binder or Al paste by thick film printing. The anode conductors 13 each have a phosphor layer 14 deposited thereon. The phosphor layers 14 each are made of a phosphor paste consisting of a phosphor powder and a vehicle by printing and formed into the same configuration as each of the picture cells or segments 10 of the display pattern 8. This results in the anode 15 being provided for every segment 10 of the display pattern 8. Arranged above each of the anodes 15 of the display pattern 8 is a grid or control electrode 16. The fluorescent display device 1 also includes filamentary cathodes 17 arranged above the grids 16.

The conventional fluorescent display device 1 constructed as described above is operated in such a manner that the filamentary cathodes 17 are driven for heating, resulting in thermions being emitted from the filamentary cathodes 17. Then, the thus-generated thermions are accelerated by the grids 16 having a positive voltage applied thereto while being controlled thereby, to thereby be impinged on the phosphor layer 14 of each of the anodes 15 positioned below the grids, resulting in the phosphor layer 14 being excited for luminescence, leading to desired display.

The fluorescent display device is mounted on a circuit board having various circuit parts mounted thereon. Such mounting, as shown in FIG. 9, is carried out by downwardly bending each of lead terminals 21 of various electrodes (anodes 15, grids 16, cathodes 17 and GNDs) led out of the envelope 2 in a horizontal direction along the substrate 3 by an angle of 90 degrees, inserting each of the lead terminals 21 in each of the through-holes 23 of the circuit board 22 electrically connected to the wiring pattern on a circuit board 22, and then fixing each lead terminal 21 in each through-hole 23 of the circuit board 22 by soldering in a reflow oven.

However, the above-described soldering in the reflow oven causes the fluorescent display device 1 to be introduced into the reflow oven being heated while being controlled, so that the fluorescent display device 1 is increased in temperature. This causes gas adhering to the cathodes 17 and phosphor layers 14 in the envelope 2 to be driven out thereof, resulting in a reduction vacuum in the envelope 2, leading to a deterioration in luminance of the fluorescent display device. In order to eliminate the problems, it is required to carry out an aging step of continuously driving the fluorescent display device 1 again. Mounting of the circuit parts on the circuit board 22 is carried out by surface mounting without introducing the circuit parts into the reflow oven, so that it is required to carry out soldering of the fluorescent display device 1 to the circuit board 22 in a step separate from that of mounting the circuit parts on the circuit board 22. This causes an increase in assembling cost of the fluorescent display device and a deterioration in operating efficiency.

Also, a fluorescent display device recently developed is generally increased in the number of lead terminals depending on desired display and reduced in pitches between the lead terminals in order to carry out complicated graphic display. This causes soldering in the reflow oven to be highly hard to form the lead terminal-inserting through-holes via the circuit board.

In view of the above, techniques of surface-mounting the fluorescent display device on the circuit board which are carried out without requiring formation of the through-hole via the circuit board are proposed as substitution for the above-described soldering in the reflow oven. The techniques proposed are practiced in such a manner as shown in FIG. 10. More particularly, lead terminals 21 of various electrodes including anodes 15, grids 16, cathodes 17 and GNDs each are led out of an envelope 2 of a fluorescent display device in a manner to horizontally extend along a substrate 3 and then bent at an intermediate portion thereof into an inverted L shape. Then, the lead terminals 21 each are formed at a distal end thereof with a substantially horizontal portion, which is provided thereon with a preliminary solder 24. Thereafter, the preliminary solders 24 each are arranged so as to face each of solder pads 25 positioned on connections on a wiring pattern of a circuit board 22. Then, soldering is carried out by means of a hot bar or manually between the solders 24 and the solder pads 25, resulting in the fluorescent display device 1 being mounted on the circuit board.

However, in the case that the fluorescent display device is so constructed that a lot of such lead terminals 21 are arranged and pitches between the lead terminals 21 are reduced, soldering by means of the hot bar causes short-circuiting between the lead terminals 21 adjacent to each other when the amount of solder used is increased. Also, a reduction in amount of solder leads to a failure in electrical connection between the connections on the wiring pattern and the lead terminals.

Also, manual soldering requires to solder the lead terminals 21 of the fluorescent display device to the circuit board one by one, resulting the soldering being not only time-consuming but highly troublesome.

In the prior art, when the fluorescent display device is to be shipped to a customer while being kept mounted on the circuit board, it is generally carried out to mount the circuit parts on the circuit board and then solder the lead terminals of the fluorescent display device to the circuit board in a last step. However, this causes mounting of the circuit boards on the circuit board and mounting of the fluorescent display device thereon to be carried out separately from each other, leading to a deterioration in operating efficiency. Thus, it is desired to concurrently carry out mounting of the circuit parts on the circuit board and mounting of the fluorescent display device thereon in a single step.

Also, the lead terminals are led out of the envelope. Such arrangement of the lead terminals leads to a variation in pitches between the lead terminals and damage to the lead terminals due to deformation thereof before and/or after mounting of the fluorescent display device on the circuit board, when pitches between the lead terminals are reduced and the lead terminals are formed into a thin shape.

Further, a variation or deviation in pitches between the lead terminals and deformation thereof likewise occur during a period of time for which the fluorescent display device is transported to a customer and then mounted on the circuit board in a site of the customer.

SUMMARY OF THE INVENTION

The present invention has been made in view of the foregoing disadvantage of the prior art.

Accordingly, it is an object of the present invention to provide a fluorescent display device which is capable of minimizing a variation in pitches between lead terminals of a fluorescent display device and deformation of the lead terminals.

It is another object of the present invention to provide a fluorescent display device which is capable of being positively mounted on a circuit board without soldering.

In accordance with the present invention, a fluorescent display device is provided. The fluorescent display device includes a box-like envelope having a vacuum held therein and including a substrate constituting a part thereof, various electrodes arranged in the envelope and having lead terminals led out of the envelope while horizontally extending on the substrate, a mounting holder arranged on a surface of the envelope opposite to a display surface thereof and having recess-like terminal holding holes formed at edges thereof at which side surfaces thereof and a bottom surface thereof intersect each other, and a fixing means for fixing the mounting holder and a circuit board on which the fluorescent display device is to be mounted to each other. The lead terminals each are bent at a distal end thereof so that the distal end is held in each of the terminal holding holes to hold the mounting holder therein, so that the fluorescent display device is mounted on the circuit board while keeping the mounting holder and circuit board fixed to each other through the fixing means and keeping the lead terminals pressedly contacted with connections on the circuit board.

In a preferred embodiment of the present invention, the terminal holding holes each are formed in a manner to correspond to a width of each of the lead terminals and a pitch thereof so that each of the lead terminals is received in each of the terminal holding holes.

Also, in a preferred embodiment of the present invention, the connections on the circuit board each are provided thereon with a solder pad, wherein the lead terminals each are soldered to each of the solder pads while pressedly contacting the distal end of each of the lead terminals with each of the solder pads.

BRIEF DESCRIPTION OF THE DRAWINGS

These and other objects and many of the attendant advantages of the present invention will be readily appreciated as the same becomes better understood by reference to the following description when considered in connection with the accompanying drawings; wherein

FIG. 3 is a side elevation view showing a modification of a terminal holding hole of a mounting holder integrally provided on a fluorescent display device according to the present invention;

DETAILED DESCRIPTION OF THE PREFERRED EMBODIMENTS

Figure 1:
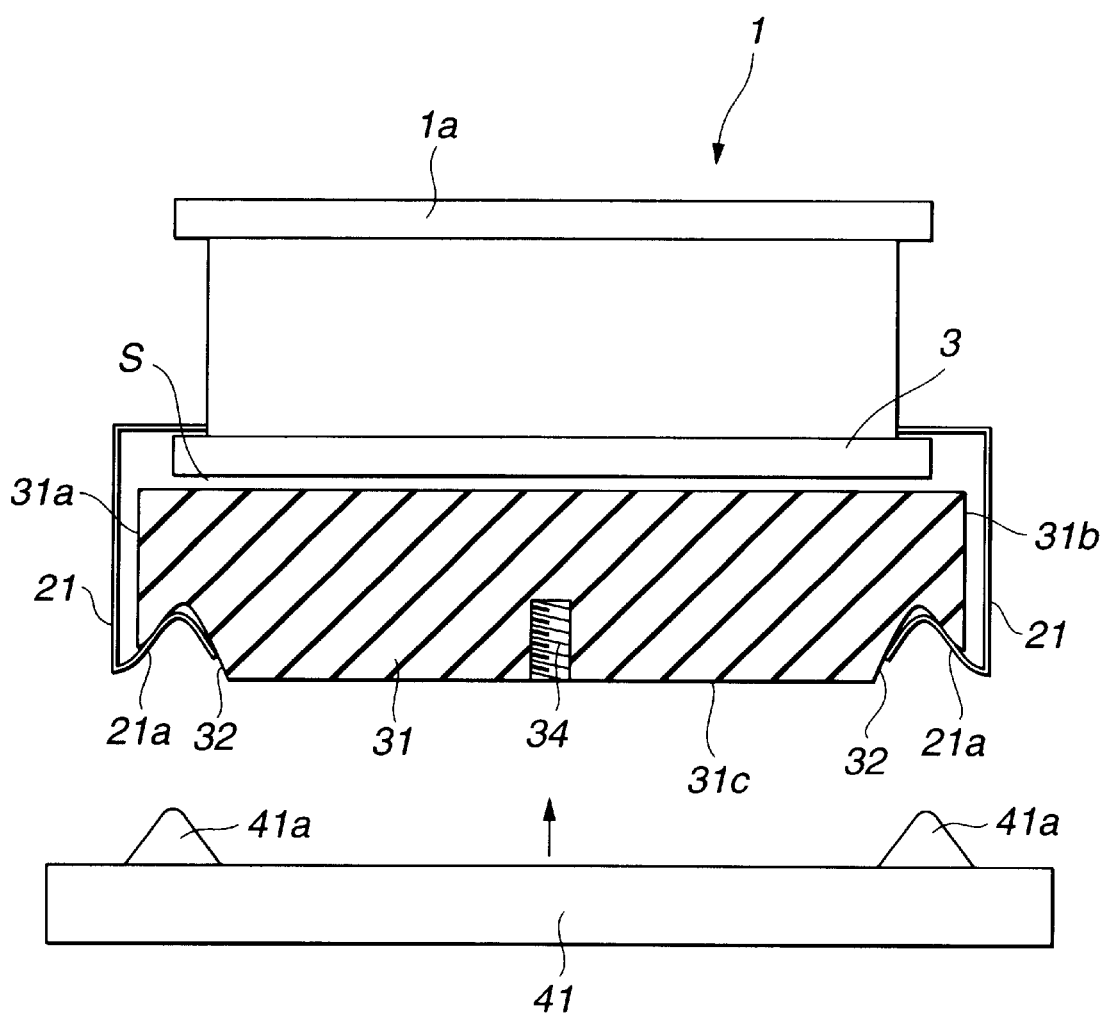
FIG. 1 is a front elevation view showing an embodiment of a fluorescent display device according to the present invention, which is equipped with a mounting holder.

Now, a fluorescent display device according to the present invention will be described hereinafter with reference to FIGS. 1 to 6 and 11 to 13(c), wherein like reference numerals designate like or corresponding parts therethrough.

Referring first to FIGS. 1 to 5, an embodiment of a fluorescent display device according to the present invention is illustrated, which is equipped with a mounting holder.

Figure 7:
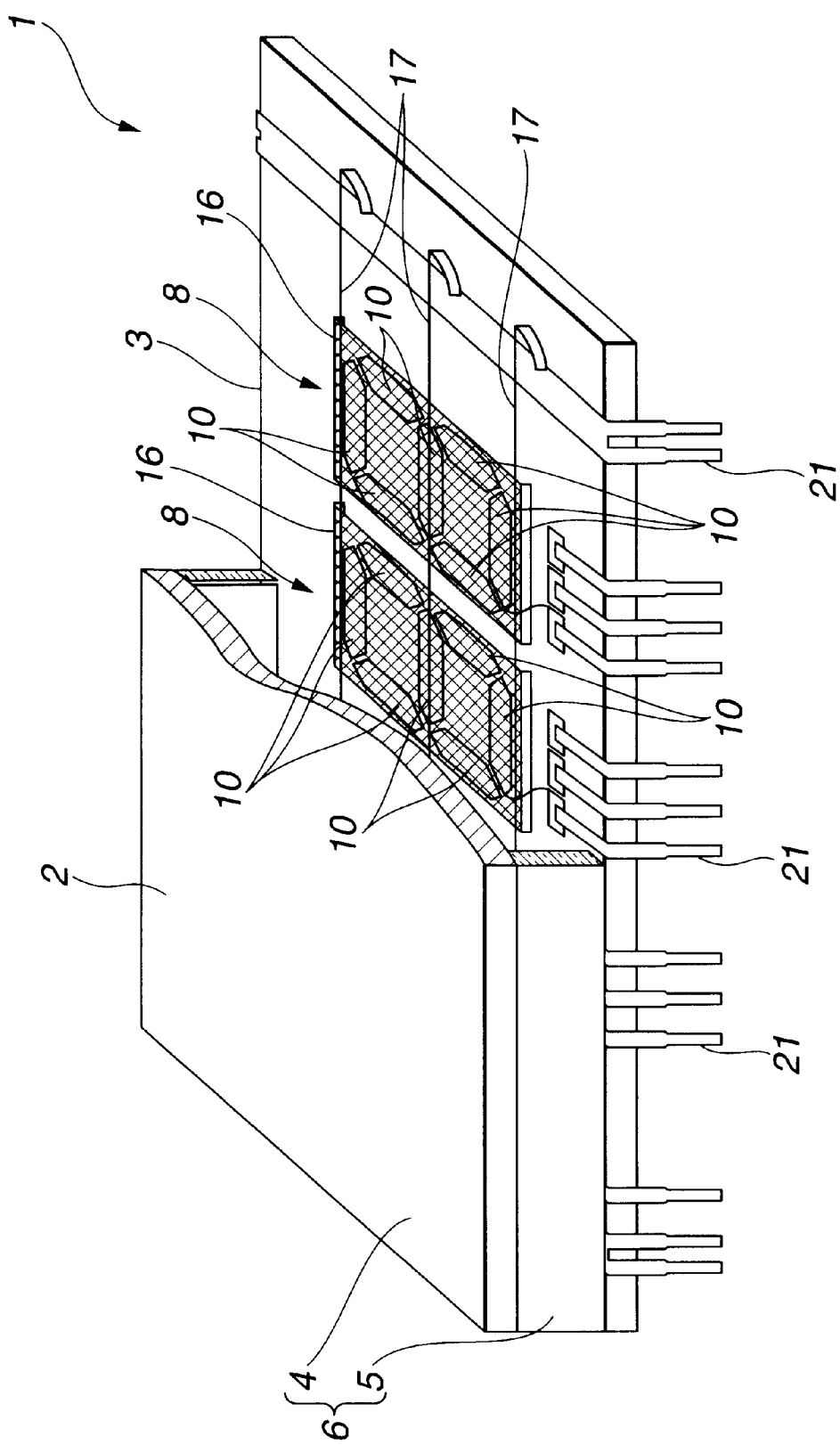
FIG. 7 is a partially cutaway perspective view showing a conventional fluorescent display device which is widely known in the art.
Figure 8:
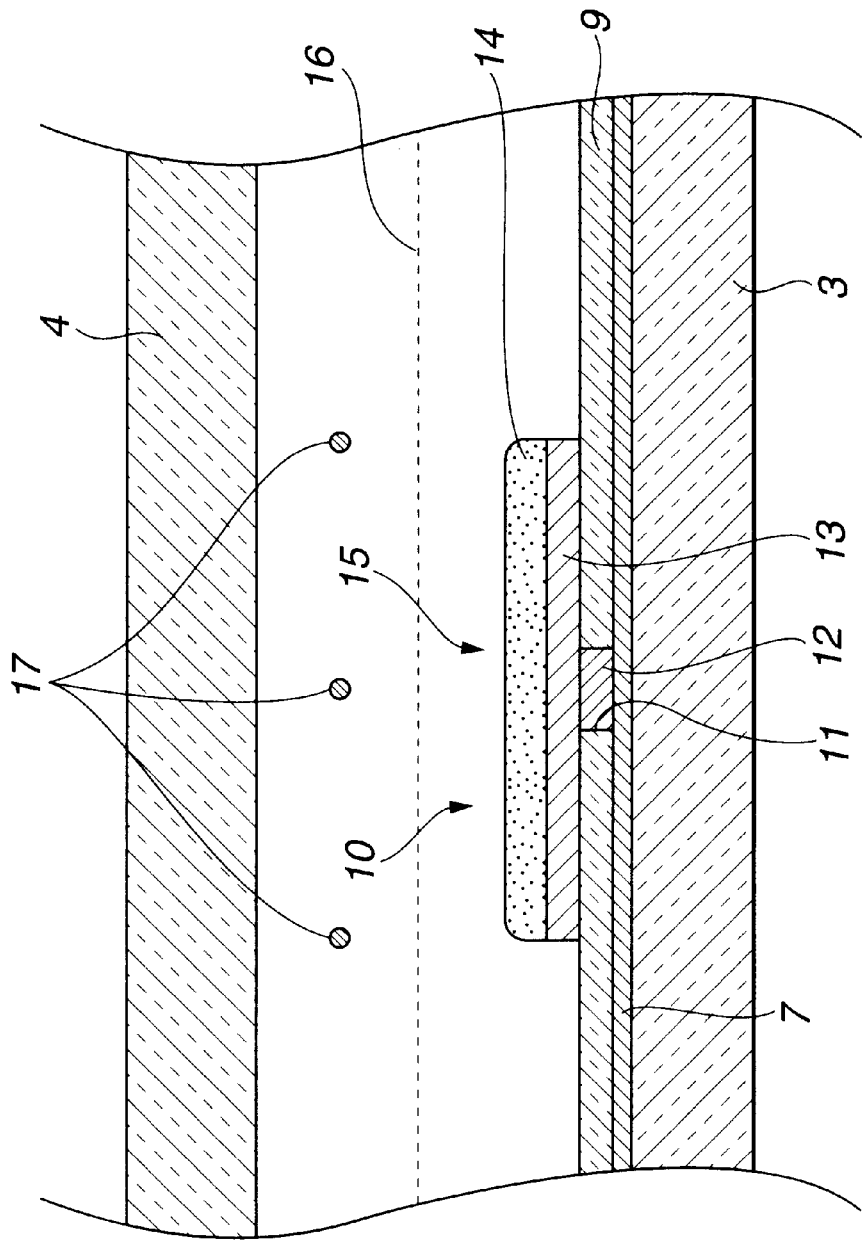
FIG. 8 is a fragmentary sectional view of the fluorescent display device shown in FIG. 7.
Figure 9:
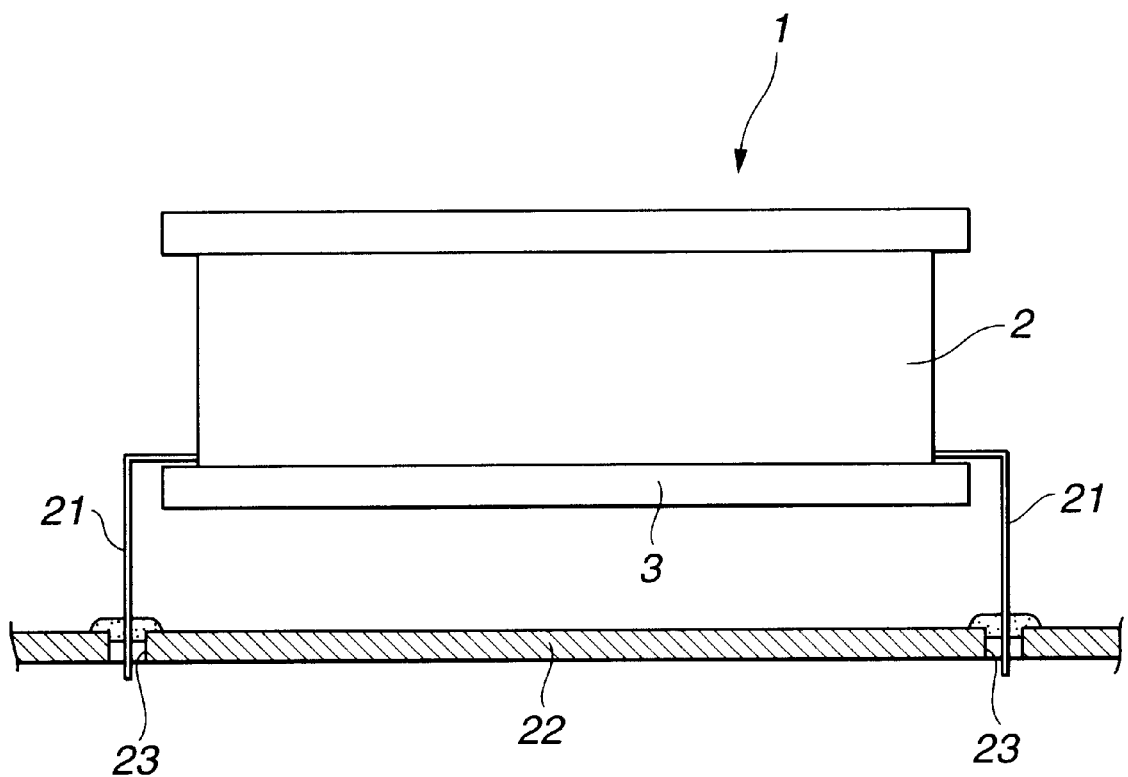
FIG. 9 is a schematic view showing a manner of mounting of a fluorescent display device on a printed circuit board which has been conventionally carried out.
Figure 10:
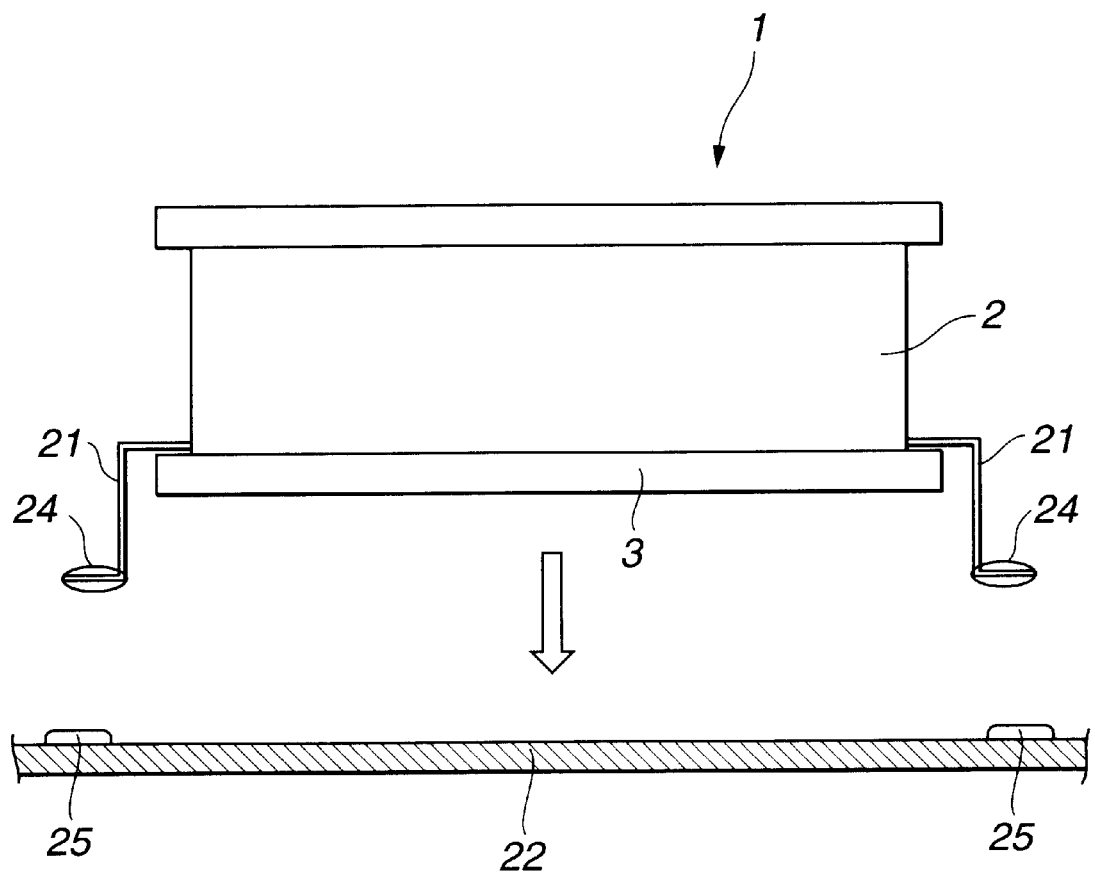
FIG. 10 is a schematic view showing a conventional manner of mounting a fluorescent display device on a circuit board by means of a reflow oven.

A mounting holder-equipped fluorescent display device of the illustrated embodiment which is generally designated at reference numeral 1 includes an envelope 2, which is constructed in substantially the same manner as the conventional envelope 2 described above with reference to FIGS. 7 and 8.

The fluorescent display device 1 of the illustrated embodiment is equipped with a mounting holder 31 which, when the fluorescent display device 1 is mounted on a circuit board 22, acts as an intermediate member between the fluorescent display device 1 and the circuit board 22.

The mounting holder 31 is arranged on a surface of the fluorescent display device 1 opposite to a display surface 1a thereof in a manner to be spaced at a gap S of a microdistance from the surface while being held in lead terminals 21 of the fluorescent display device 1. In the illustrated embodiment, the mounting holder 31 is arranged on a lower surface of a substrate 3 of the envelope 2 of the fluorescent display device 1 through the gap S. Alternatively, the mounting holder 31 is arranged directly on the surface of the substrate 3 of the envelope 2 without the gap S. The lead terminals 21 of the fluorescent display device 1 each are led out of each of various electrodes including anodes, grids, cathodes and GNDs.

The mounting holder 31 is made of an insulating material. For example, the mounting holder 31 may be made of a resin material such as acrylic resin or the like, resulting in being reduced in weight. Alternatively, the mounting holder 31 may be made of an aluminum matrix having an insulating film formed thereof. This permits the mounting holder 31 to act as a heat sink for externally dissipating heat generated during driving of the fluorescent display device 1 as well.

Figure 2:
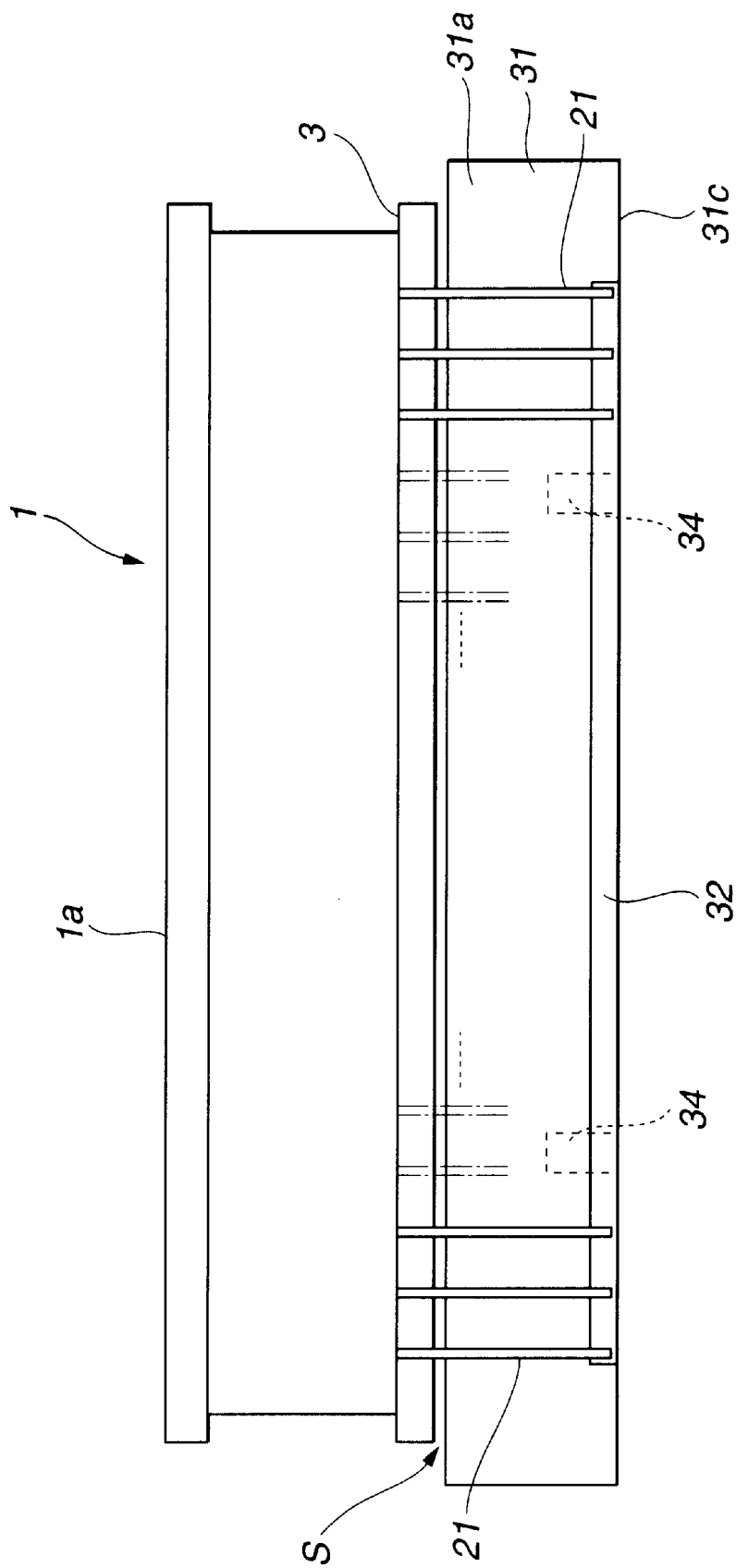
FIG. 2 is a side elevation view of the mounting holder-equipped fluorescent display device shown in FIG. 1.

The mounting holder 31, as shown in FIGS. 1 and 2, includes terminal holding holes 32 formed at edges at which side surfaces 31a and 31b of the holder 31 intersect a bottom surface 31c thereof. The terminal holding holes 32 each are formed into a recessed shape. More particularly, the terminal holding holes 32, as shown in FIG. 1, each are cut out into a dog-legged shape as viewed in a lateral direction of the fluorescent display device 1. Also, when the fluorescent display device is viewed in a longitudinal direction thereof, the terminal holding holes 32, as shown in FIG. 2, each have a rectangular recess-like shape which permits each of the lead terminals 21 of the fluorescent display device 1 to be received therein.

Alternatively, the terminal holding holes 31, as shown in FIG. 3, each may be formed in a manner to correspond to a width of each of the lead terminals 21 and a pitch thereof so that each of the lead terminals 21 is received in each of the terminal holding holes 31, when the fluorescent display device 1 is viewed in the longitudinal direction thereof. Such construction permits the lead terminals 21 to be received in the single mounting holder 31 and pitches between the lead terminals 21 to be kept constant, resulting in effectively preventing a variation or deviation in pitches of the lead terminals before and/or after the fluorescent display device 1 is mounted on the circuit board 22. This permits the fluorescent display device 1 equipped with the mounting holder 31 to be mounted on the circuit board 22 while positively preventing short-circuiting between the lead terminals 21 adjacent to each other.

The mounting holder 31, as shown in FIGS. 1 and 2, is formed on the bottom surface 31c thereof with taps 34, each of which cooperates with each of screws threadedly fitted therein, to thereby constitute a fixing means 33. The screws will be described in detail hereinafter. In the illustrated embodiment, as shown in FIG. 2, the taps 34 are arranged at two locations of the fluorescent display device 1 defined in the longitudinal direction thereof. However, the number of taps 34 to be formed and positions thereof may be determined depending on a length of the fluorescent display device 1 defined in the longitudinal direction thereof.

The lead terminals 21 of the electrodes of the fluorescent display device 1, as shown in FIG. 1, are led out of the envelope 2 while substantially horizontally extending on the substrate 3. Then, they each are downwardly bent at an intermediate portion by an angle of 90 degrees and then inwardly turned up at a distal end thereof, so that the distal end may be bent in a doglegged shape to provide a doglegged bent portion 21a, which is then held in each of the terminal holding holes 32 of the mounting holder 31.

Such bending of the lead terminal 21 may be carried out by means of a female die constituted by the mounting holder 31 formed with the recess-like or cut-out terminal holding holes 32 and a male die 41 constituted by a member having chevron-like projections 41a formed on portions thereof corresponding to the terminal holding holes 32 so as to be aligned with the terminal holding holes 32.

More particularly, the mounting holder 31 is positioned under the fluorescent display device 1 while keeping the lead terminals 21 bent into a U-shape toward an inside of the fluorescent display device 2. Then, the male die 41 having the projections 41a provided on the portions thereof corresponding to the terminal holding holes 32 is moved as indicated at an arrow in FIG. 1, to thereby caulk the distal end of each of the lead terminals 21 so that the distal end may bite into the mounting holder 31. This permits the lead terminals 21 to be held at the distal end thereof in the terminal holding holes 32 while the fluorescent display device 1 holds the mounting holder 31 therein with the space S being defined therebetween.

Figure 4A:
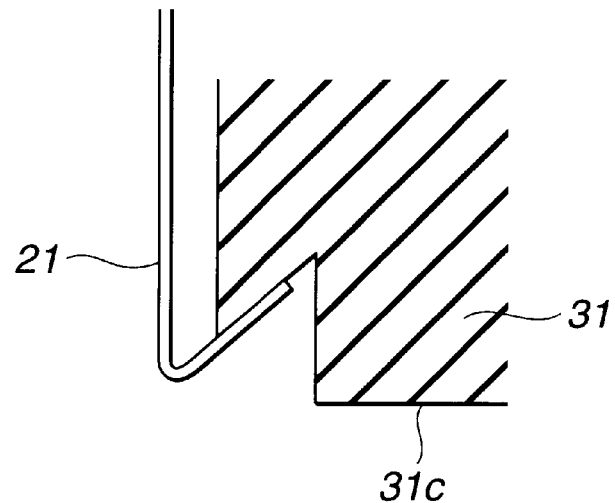
FIGS. 4(a) and 4(b) each are a fragmentary enlarged view showing a modification of lead terminals incorporated in a fluorescent display device according to the present invention.
Figure 4B:
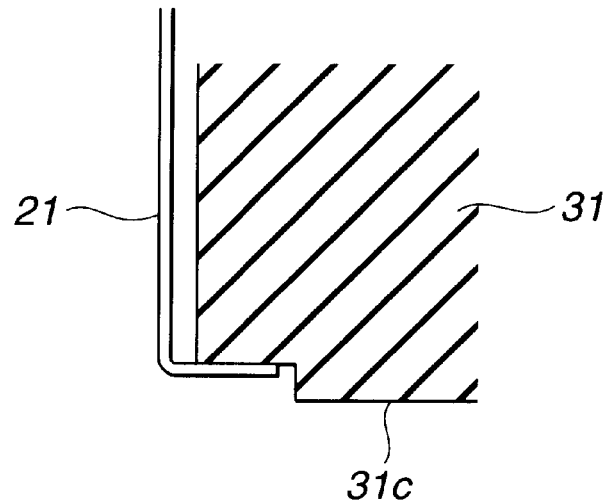

A configuration of the lead terminals 21 is not limited to that shown in FIG. 1. For example, the lead terminals 21 may be formed into such a configuration as shown in FIG. 4(a) or 4(b). In FIG. 4(a), the lead terminals 21 each are led out of the envelope 2 in a manner to substantially horizontally extend along a surface of the substrate 3 and then downwardly bent at an intermediate portion thereof by an angle of 90 degrees. Then, the lead terminals 21 each are inwardly bent at a distal end thereof by a predetermined angle. In FIG. 4(b), the lead terminals 21 each are led out of the envelope 2 while being kept substantially horizontal on the substrate 3 and then downwardly bent at an intermediate portion thereof by an angle of 90 degrees. Then, a distal end of each lead terminal 21 is inwardly bent at a right angle or by 90 degrees.

Figure 5:
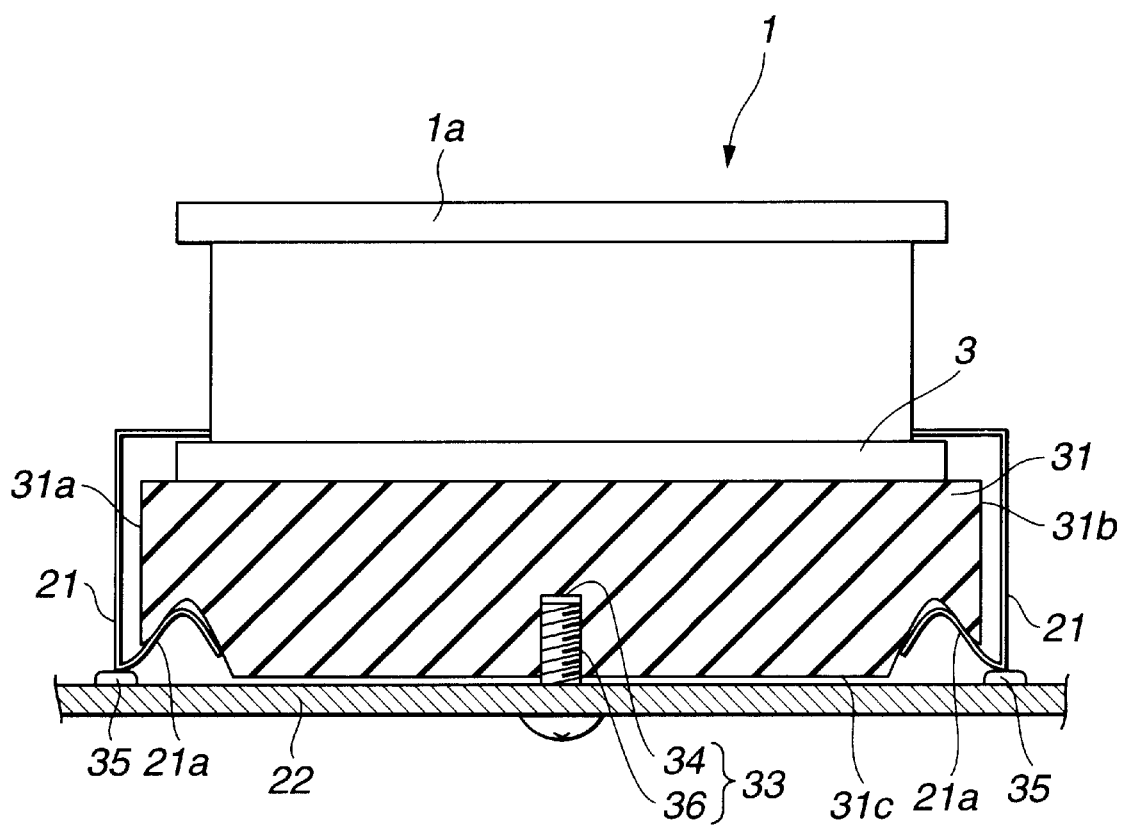
FIG. 5 is a schematic view showing mounting of the mounting holder-equipped fluorescent display device shown in FIG. 1 on a circuit board.
Figure 6:
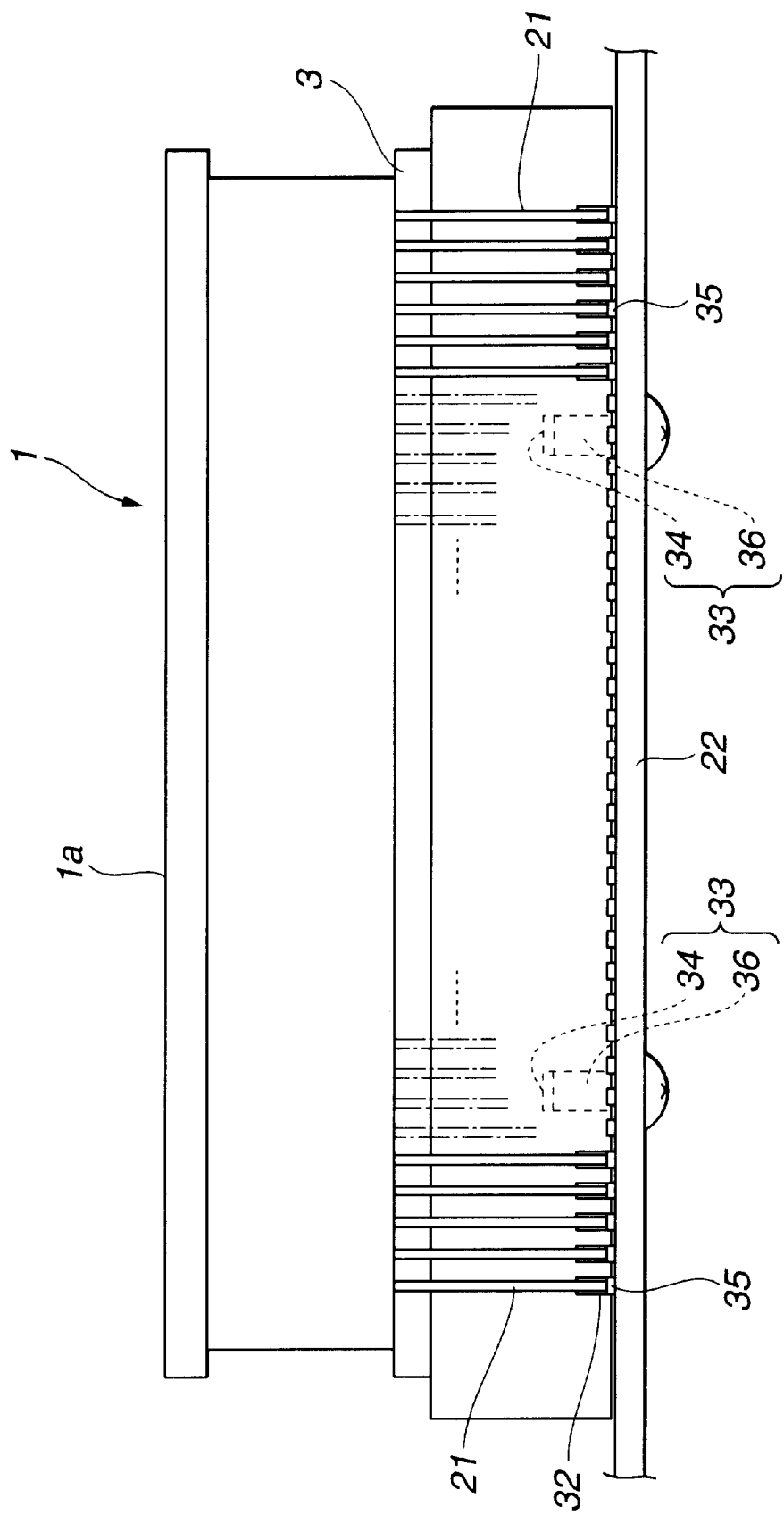
FIG. 6 is a side elevation view of the fluorescent display device of FIG. 5 mounted on the circuit board.

Now, a manner of mounting the thus-configured fluorescent display device 1 equipped with the mounting holder 31 on the circuit board 22 will be described with reference to FIGS. 5 and 6. First, the mounting holder-equipped fluorescent display device 1 is carried on the circuit board 22 while aligning the lead terminals 21 with connections 35 provided on a wiring pattern on the circuit board 22. Then, screws 33 each are threadedly inserted through the circuit board 33 from a rear surface thereof, resulting in being securely tightened in each of the taps 34. This permits the fluorescent display device 1 equipped with the mounting holder 31 to be fixed on the circuit board 22 while keeping the lead terminals 21 of the fluorescent display device 1 pressedly contacted with the corresponding connections 35 on the circuit boards 22 to ensure electrical connection therebetween.

Thus, it will be noted that the illustrated embodiment leads to fixed mounting of the fluorescent display device 1 on the circuit board 22 while ensuring electrical connection between the fluorescent display device 1 and the wiring pattern on the circuit board 22 due to press-contact between the lead terminals 21 and the connections 35 of the wiring pattern without requiring any soldering. Such elimination of soldering effectively prevents short-circuiting between the lead terminals adjacent to each other even when the lead terminals 21 are arranged at reduced pitches. Also, the illustrated embodiment eliminates a necessity of using a lead solder which has been conventionally commonly used as a solder, to thereby ensure satisfactory electrical connection while contributing to environmental protection and saving waste consumption of a material.

From a viewpoint of environmental protection, it is preferable to eliminate use of a lead solder. However, a solder pad may be provided on each of the connections 35 of the wiring pattern on the circuit board 22, so that soldering may take place by melting the solder pad while keeping the lead terminals 21 pressedly contacted with the solder pads. This leads to more reliable electrical connection of the lead terminals 21 to the wiring pattern.

Also, the above-described construction of the illustrated embodiment facilitates mounting of the fluorescent display device 1 on the circuit board 22 by fixing the fluorescent display device 1 onto the circuit board 22 using the fixing means 33 constituted by a combination between the taps 34 and the screws 36 while holding the lead terminals 21 in the terminal holding holes 32 of the mounting holder 31 to fit the fluorescent display device 1 on the mounting holder 31, so that mounting of the fluorescent display device on the circuit board 22 may be concurrently accomplished in a step of mounting various circuit parts thereon. This leads to an improvement in workability and a reduction in manufacturing cost. Further, the construction of the illustrated embodiment minimizes damage to the lead terminals due to a variation or deviation in pitches between the lead terminals and deformation thereof before and/or after mounting of the fluorescent display device on the printed circuit board, even when pitches between the lead terminals are reduced or the lead terminals are formed into a thin shape.

In addition, the fluorescent display device of the illustrated embodiment minimizes a variation or deviation in pitches between the lead terminals and deformation thereof which may possibly occur when the fluorescent display device is transported to a customer and then mounted on the circuit board in a site of the customer.

Furthermore, the above-described construction of the fluorescent display device permits mounting of the fluorescent display device on the circuit board to be concurrently carried out in the step of mounting the circuit parts thereon, to thereby facilitate automation in mounting of the fluorescent display device.

In the illustrated embodiment, as described above, the fixing means 33 is constituted by a combination of the taps 34 of the mounting holder 31 and the screws 36, so that the fluorescent display device 1 equipped with the mounting holder 31 may be fixed on the circuit board 22 by threadedly inserting the screws 36 through the circuit board 22 from the rear surface of the circuit board 22 and securely tightening the screws 36 in the taps 34. Alternatively, the fixing means 33 may be constituted by an adhesive, so that fixing between the mounting holder 31 and the circuit board 22 may be carried out directly by means of the adhesive.

Moreover, in the illustrated embodiment, the lead terminals of the fluorescent display device are led out from both sides of the substrate. However, the illustrated embodiment may be likewise applied to a configuration like the conventional configuration described above with reference to FIG. 7 wherein the lead terminals are led out from one side of the envelope 2. Also, the illustrated embodiment is not limited to an electron source constituted by the filamentary cathodes like those shown in FIG. 8. Thus, the illustrated embodiment may be applied to an electron source constituted by field emission cathodes.

Figure 11:
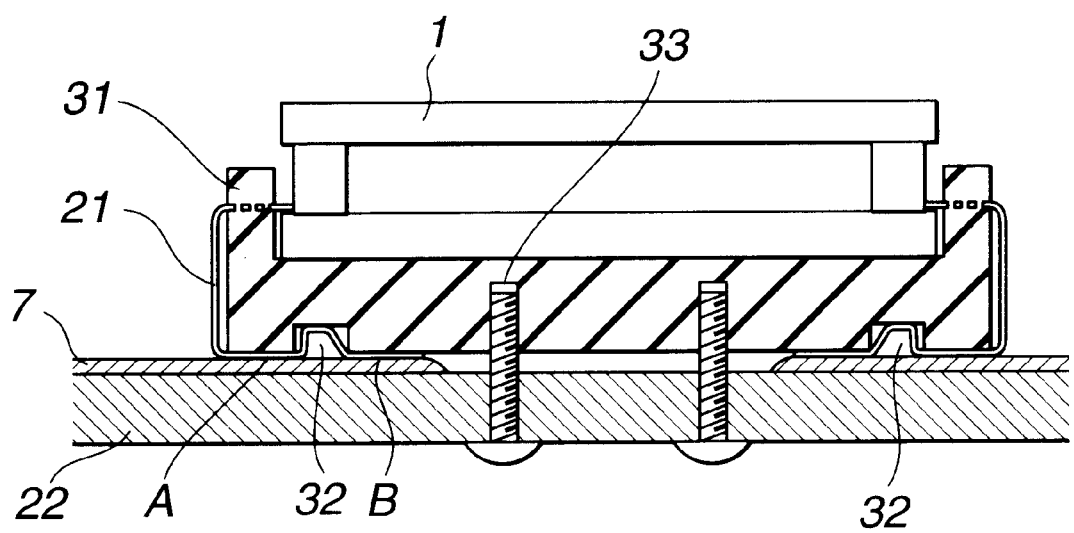
FIG. 11 is a front elevation view in section showing another embodiment of a fluorescent display device according to the present invention, which is equipped with a mounting holder.

Referring now to FIG. 11, another embodiment of a fluorescent display device according to the present invention is illustrated. In the embodiment described above, the lead terminals 21 each are connected to each of the terminals holding holes 32 of the mounting holder 31 through only one location of the terminal holding hole 32. On the contrary, in the illustrated embodiment, lead terminals 21 each are arranged so as to further extend toward a central portion of a fluorescent display device 1, to thereby be connected to a mounting holder 31 through two portions A and B on the mounting holder 31. Such construction ensures that the lead terminals 21 are more reliably electrically connected to a wiring pattern on a circuit board 22.

Figure 12A:
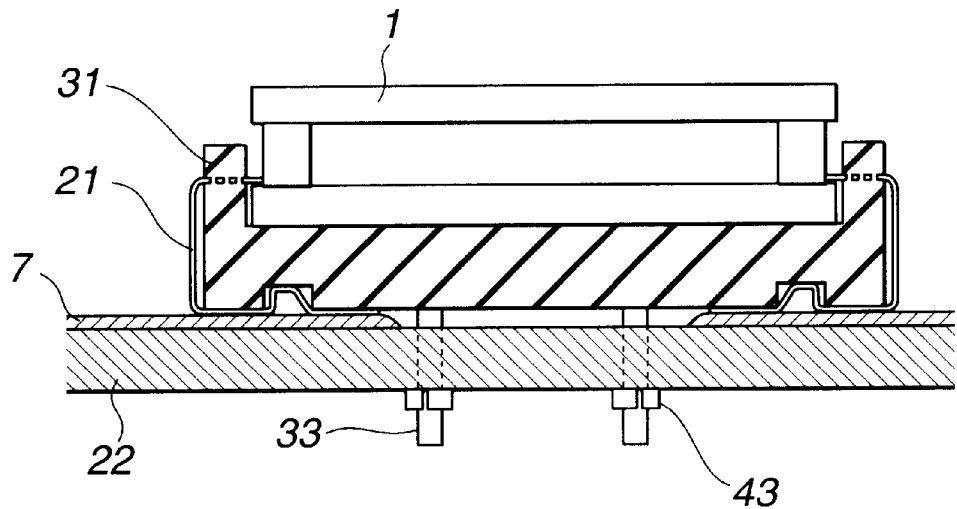
FIGS. 12(a) and 12(b) each are a front elevation view in section showing another example of a fixing means for fixing a mounting holder integrally provided on a fluorescent display device according to the present invention and a circuit board to each other.
Figure 12B:
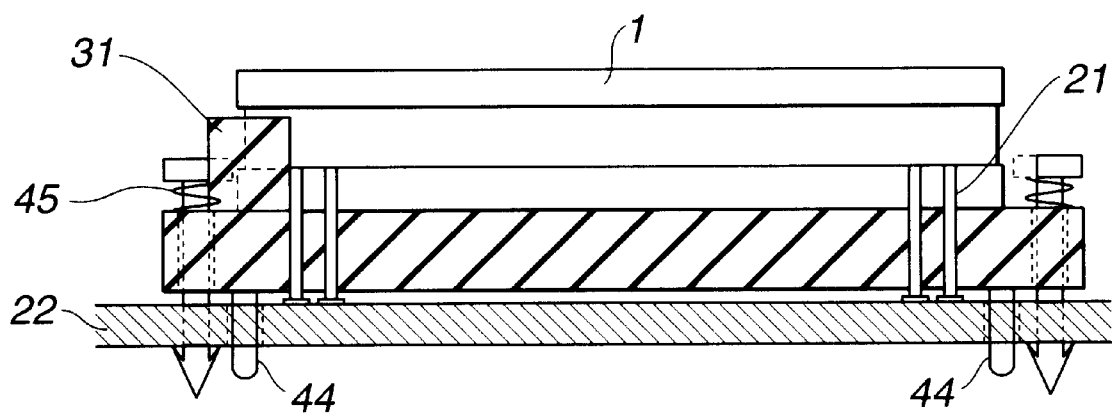

In the illustrated embodiment, a fixing means 33 may be constituted by at least one screw 36 threadedly inserted through a rear surface of the circuit board 22 and at least one tap 34 in which the screw 36 is tightened. Alternatively, two or more screws 36 may be used for this purpose, to thereby more firmly fix the fluorescent display device 1 equipped with a mounting holder 31 and the circuit board 22 to each other. Also, the fixing means 33 may be constructed as shown in FIG. 12(a) or 12(b). In FIG. 12(a), pins inserted through the circuit substrate 22 are fixed by means of cotter pins 43. In FIG. 12(b), the mounting holder 31 are mounted thereon with guide/positioning pins 44 to fix both to each other through elastic members 45 such as springs or the like interposed therebetween.

Figure 13A:
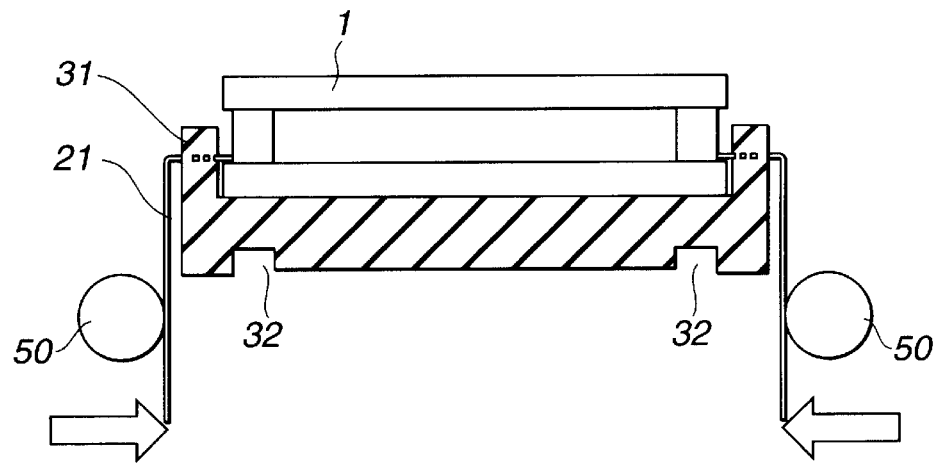
FIGS. 13(a) to 13(c) each are a front elevation view in section showing mounting of a fluorescent display device according to the present invention on a circuit board.
Figure 13B:
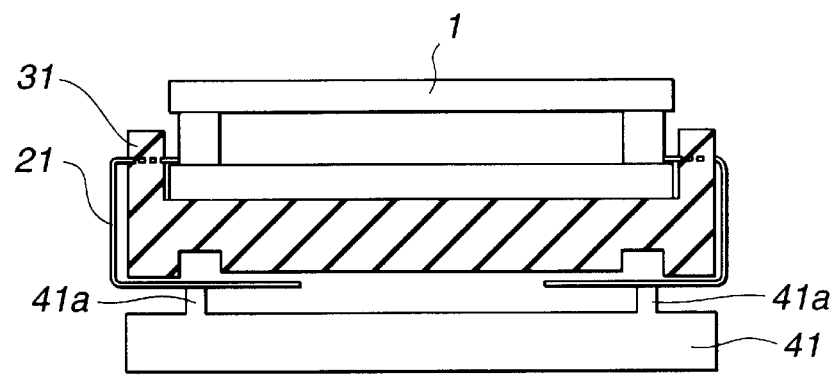
Figure 13C:
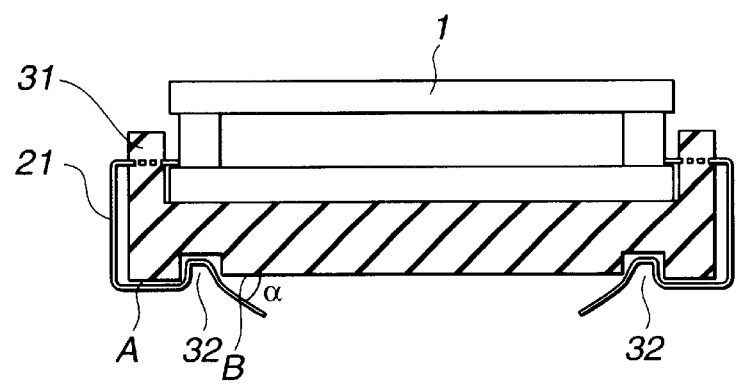

Now, a manner of mounting the mounding holder-equipped fluorescent display device 1 of the illustrated embodiment constructed as described above on the circuit board 22 will be described with reference to FIGS. 13(a) to 13(c). First, as shown in FIG. 13(a), the lead terminals 21 each are arranged at a predetermined position on the circuit board 21 and then rollers 50 each are moved, to thereby inwardly bend a distal end of each of the lead terminals 21 by an angle of 90 degrees. Then, shaping of the lead terminals 21 is carried out as shown in FIG. 13(b). More particularly, for this purpose, the mounting holder 31 formed with recess-like terminal holding holes 32 is used as a female die and a member 41 formed on portions thereof opposite to the terminal holding holes 32 with projections 41a mated with the holes 32 is used as a male die. This results in a distal end of each of the lead terminals 21 being downwardly deformed as shown in FIG. 13(c), to thereby ensure that the lead terminals 21 may be positively electrically connected to the wiring pattern on the circuit board 22.

In the illustrated embodiment, the portion B of the mounting holder 31 may be constituted by the terminal holding hole 32 formed into a depth smaller than that for the position A, to thereby reduce a deformation angle $\alpha$ of the distal end of the lead wire 21.

As can be seen form the foregoing, the present invention permits the fluorescent display device to be mounted on the circuit board while electrically connecting the lead terminals to the connections of the wiring pattern on the circuit board without soldering, to thereby prevent short-circuiting between the lead terminals.

Also, in the present invention, soldering may be carried out by arranging the solder pads on the connections of the wiring pattern on the circuit board and then melting the solder pads while pressedly contacting the lead terminals with the solder pads. This ensures that the lead terminals are positively electrically connected to the wiring pattern on the circuit board.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A fluorescent display device comprising:

a box-shaped envelope having a vacuum held therein and including a substrate constituting a part thereof;

various electrodes arranged in said envelope and having lead terminals led out of said envelope while horizontally extending on said substrate;

a mounting holder arranged on a surface of said envelope opposite to a display surface thereof and having recessed terminal holding holes formed at edges thereof at which side surfaces thereof and a bottom surface thereof intersect each other; and a fixing means for fixing said mounting holder and a circuit board on which the fluorescent display device is to be mounted to each other;

said lead terminals each being bent at a distal end thereof so that said distal end is held in each of said terminal holding holes to hold said mounting holder therein;

whereby the fluorescent display device is mounted on said circuit board while keeping said mounting holder and circuit board fixed to each other through said fixing means and keeping said lead terminals pressedly contacted with connections on said circuit board.

2. A fluorescent display device as defined in claim 1, wherein said terminal holding holes each are formed in a manner to correspond to a width of each of said lead terminals and a pitch thereof so that each of said lead terminals is received in each of said terminal holding holes.

3. A fluorescent display device as defined in claim 1 or 2, wherein said connections on said circuit board each are provided thereon with a solder pad;

said lead terminals each being soldered to each of said solder pads while pressedly contacting said distal end of each of said lead terminals with each of said solder pads.

* * * * *